United States Patent [19]
Janisiewicz et al.

[11] Patent Number: 4,611,397
[45] Date of Patent: Sep. 16, 1986

[54] PICK AND PLACE METHOD AND APPARATUS FOR HANDLING ELECTRICAL COMPONENTS

[75] Inventors: Stanley W. Janisiewicz, Endwell; Edward J. Lovell, Binghamton, both of N.Y.

[73] Assignee: Universal Instruments Corporation, Binghamton, N.Y.

[21] Appl. No.: 658,827

[22] Filed: Oct. 9, 1984

[51] Int. Cl.⁴ .................... H05K 3/30; B23P 19/00
[52] U.S. Cl. ........................ 29/834; 29/740; 29/705; 29/714
[58] Field of Search ............ 29/740, 714, 705, 832, 29/834; 294/64.1; 414/226

[56] References Cited

U.S. PATENT DOCUMENTS

| 3,337,941 | 8/1967 | Drop | 29/705 |
| 3,453,714 | 7/1969 | Clark et al. | 29/714 |
| 3,731,867 | 5/1973 | Frisbie et al. | 29/714 X |
| 4,327,482 | 5/1982 | Araki et al. | 29/740 |
| 4,381,601 | 5/1983 | Tamai et al. | 29/743 |
| 4,438,559 | 3/1984 | Asai et al. | 29/740 |
| 4,473,247 | 9/1984 | Itemadani et al. | 29/740 X |
| 4,515,507 | 5/1985 | Asai et al. | 29/740 X |
| 4,520,557 | 6/1985 | Harigane et al. | 29/740 |

FOREIGN PATENT DOCUMENTS

58-53887  3/1983  Japan.
59-86299  5/1984  Japan.

Primary Examiner—Howard N. Goldberg
Assistant Examiner—Carl J. Arbes
Attorney, Agent, or Firm—Fidelman, Wolffe & Waldron

[57] ABSTRACT

A component is centered and oriented on a pick and place head by positive closing of pivotal fingers onto the component which is supported on a vacuum tube, and subsequent placement pressure is sensed and controlled. Rapid automated changing of component-engaging tips of the centering fingers is also provided.

10 Claims, 17 Drawing Figures

PICK AND PLACE METHOD AND APPARATUS FOR HANDLING ELECTRICAL COMPONENTS

CROSS REFERENCES TO THE PRIOR ART

U.S. Pat. No. 4,135,630—CENTERING DEVICE FOR AUTOMATIC PLACEMENT OF CHIP COMPONENTS in HYBRID CIRCUITS—Synder, et al., issued Jan. 23, 1979.

German Pat. No. 2,944,810—published May 14, 1980 having the same drawings as U.S. Pat. No. 4,381,601—APPARATUS FOR MOUNTING ELECTRONIC COMPONENTS—Tamai, et al., issued May 3, 1983.

U.S. Pat. No. 4,437,232—ELECTRONIC PARTS MOUNTING APPARATUS—Araki, et al., issued Mar. 20, 1984.

Japanese Patent Application No. 58-185651—ELECTRONIC PARTS POSITIONING/HOLDING APPARATUS—Asai, et al., laid open May 18, 1984.

BACKGROUND OF THE INVENTION

The present invention relates to apparatus for the precision placement of electronic components on a hybrid circuit substrate and, more particularly, to the placement of small articles such as semiconductor chips, capacitor chips and integrated circuit chips on a ceramic substrate which has been preprinted with a thick film conductor pattern.

As the name suggests, hybrid circuits are a combination of discrete and integrated circuit techniques. As in integrated circuits, conductors, resistors and conductive lands are printed on a ceramic substrate. In thick film technology, the printed elements are generally several mils thick. Then discrete chips are precisely positioned over the conductive lands and subsequently bonded in position in a manner to complete the electrical circuit. The printed conductor lands provide a pattern which precisely matches to the corresponding conductive portions of the chips that connect to the circuit elements within the chip as by solder. The bonded chips and substrate, with an exposed lead frame, are frequently encapsulated in toto in a potting compound for protection against physical and environmental damage. Use of unencapsulated chips on the circuit board allows for the manufacture of physically smaller circuits than those where discrete components which have already been encapsulated have their leads inserted into circuit boards fitted with receiving connectors or into predrilled holes wherein the leads are subsequently cut and clinched. A primary advantage of chips is their small size, some being nearly microscopic. Chips in the order of 0.030 by 0.030 inches square and 0.010 thick and solder connection portions and conductor lands in the order of 0.005 inches in height and width, and spaced apart by similar distances, are not uncommon. Nevertheless, for the hybrid circuit technique to be successful, the small chips must be positioned and oriented such that when placed on the substrate, all solder connection portions and lands are properly connected without error. This requires a high degree of precision in positioning which was achieved in early development of these techniques by human operators using microscopes and tweezers.

The need for automatic, rapid, precise, repeatable and low cost means to position and bond chips on substrates was apparent if the burgeoning requirements of mass production in the electronics industry were to be met.

Generally speaking, in the apparatuses which have been developed in the past, the chip or other small component, e.g., beam leaded components, are picked up and placed by a hollow probe device which is connected to a vacuum source. When the probe touches the upper flat surface of the chip, the vacuum within the probe holds the chip against the probe end. The chip is then raised, translated to the substrate, and lowered onto the substrate. Several of the cross-references listed above illustrate prior attempts to improve the precision of placement of the components onto the circuit board by combining centering fingers with the vacuum probe. Thus, while the probe supports the component by vacuum, the fingers center the component relative thereto prior to placement. Permanent bonding of chip to substrate is accomplished in some systems while the probe continues to hold the chip. In other systems, the conductive lands are pretreated with some form of tacky adhesive or soldering flux. The probe gently presses the chip surface into the tacky adhesive so that electrical contact is made with the conductive lands. Then the vacuum within the probe is released and the chip remains adhered to the substrate as the probe is withdrawn. A positive gas pressure within the probe is sometimes used to separate the chip from the probe.

Broadly speaking, other prior art designs fall generally into two categories. In the first category, the substrate and the chip are both separately, fixedly and precisely oriented and located. A transfer mechanism, usually utilizing a vacuum probe as described above, travels an invariable, repetitive path to pick up the chip and place it at one selected position on the substrate. Then, a new substrate and new chip are fed into their respective positions and the operation repeats. In the second category, the chips start out with a degree of disorientation, for example, at random in a vibratory feeder bowl. The feeder bowl, in the known manner, operates to bring each chip in turn to a precise position. From that point, the design is similar to the first category; although additional steps to angularly orient the chip may be required intermediate the feeder bowl and the precisely located substrate. Still other prior art has combined these two categories.

Another device for centering a chip on the vacuum probe prior to placement is disclosed in U.S. Pat. No. 3,982,979. Therein, the rectangular component is supported from below on a probe using a slight vacuum. The probe is centered in a four-sided cavity having the form of an inverted truncated pyramid. As the probe is lowered, the component makes contact with the cavity walls and becomes aligned thereto; at the same time, the component is centered on the probe. A substrate is precisely positioned above the cavity, and the probe is raised to position the centered component on the substrate from below.

U.S. Pat. Nos. 4,437,232 and 4,135,630, as well as German Pat. No. 2,944,810, illustrate a failure of the prior art to provide controlled, positive pressure of the centering fingers onto the component. Further, spring closing of the finger onto the component fails to provide the accuracy needed for controlled, repeatable squaring, centering and orienting by the fingers. Additionally, the prior art references do not teach orienting a component according to the requirements of the circuit board layout such that orientation occurs during gripping of the component by the centering fingers.

What is needed is an apparatus for placement of chips, e.g., integrated circuit chips, capacitor chips, on a preprinted circuit board substrate of the thick film construction. In accordance with an automated program, the apparatus should be capable at a single work station of placing a plurality of different chips of various types and physical and electrical sizes on a substrate with a high degree of precision as is required to complete the circuit. Precise location of stored chips should not be required; the apparatus should orient and center each chip after selection and prior to placement.

For adapting such a pick and place apparatus to various sets of components having different configurations, the prior art has concerned itself with totally changing or substantially modifying the pick and place head according to the configuration of the chip being handled resulting in a greater expense and down time for making such changes. What is needed is a method and apparatus for high speed automated adapting of a particular pick and place head to components of various configurations and sizes.

SUMMARY OF THE INVENTION

Components are successfully placed by a hollow pick and placement spindle having motion in the X-Y and Z planes. The spindle, using a vacuum, picks up components individually from a plurality of precisely fixed input stations, e.g., component trays, racks, feeder bowls, behind the machine and delivers them to varied locations on the substrate until the component placements have been completed. To assure precision placement of components, the substrate edges and the spindle housing provide X-Y reference points, and pivoted fingers attached to the spindle housing center the chip on the spindle while correcting for slight misorientations about the Z-axis i.e., less than 45°, prior to placement, so the chip need not be precisely positioned at the input station for selection. Additionally, the support for the centering fingers is rotated about the vacuum probe axis, while the fingers are closed on the component, to provide control of the chip during angular orientation as the circuit board layout requires.

A preferred embodiment of the invention also provides for rapid, automated changing of the tips of the centering fingers to accommodate components of varying sizes and configurations. Further, each tip of a particular set of tips for the centering fingers, may be provided with more than one area for engaging a component body so that, with a stepped component body engaging portion of each tip, each tip can handle more than one component size or configuration according to the arrangement and location of the body engaging portion of the tip, and according to controlled stopping of the vacuum probe in the "up" position, during which such centering takes place. Control of such an up-stroke stop position of the vacuum probe is facilitated by the provision of a programmable controller and a Z-axis servomotor.

Accordingly, an object of the present invention is the provision of an apparatus capable of selecting chip components successively from any of a plurality of component storage trays and placing them successively at various locations on a single substrate in accordance with component orientation requirements of the circuit board.

A further object of the present invention is the provision of an apparatus which is flexible in operation and can readily operate with a new variety of components, new substrate patterns, and new programs.

Yet another object of the present invention is an apparatus which is precise in placement of components on a substrate.

Another object of the present invention is to provide an apparatus which allows imprecision in component storage and which squares and centers components prior to placement on a substrate.

Still another object of the present invention is to provide X-Y positioning and angular reorientation of components for placement on a substrate.

An additional object of the present invention is to provide for reorienting the component about the Z-axis according to the orientation needed for the proper placement of the component on the circuit board, and in which such orientation is carried out while the component is vertically supported by the vacuum tube and clamped in the centering fingers during such reorientation, and wherein the spindle housing is rotated with the vacuum tube to accomplish the reorientation.

A further object of the present invention is an apparatus which senses and regulates placement pressure as needed.

BRIEF DESCRIPTION OF THE DRAWINGS

Throughout the drawings, like numbers are used to designate like elements, with a preferred embodiment of the invention being illustrated.

DETAILED DESCRIPTION OF THE INVENTION

Figure 1:
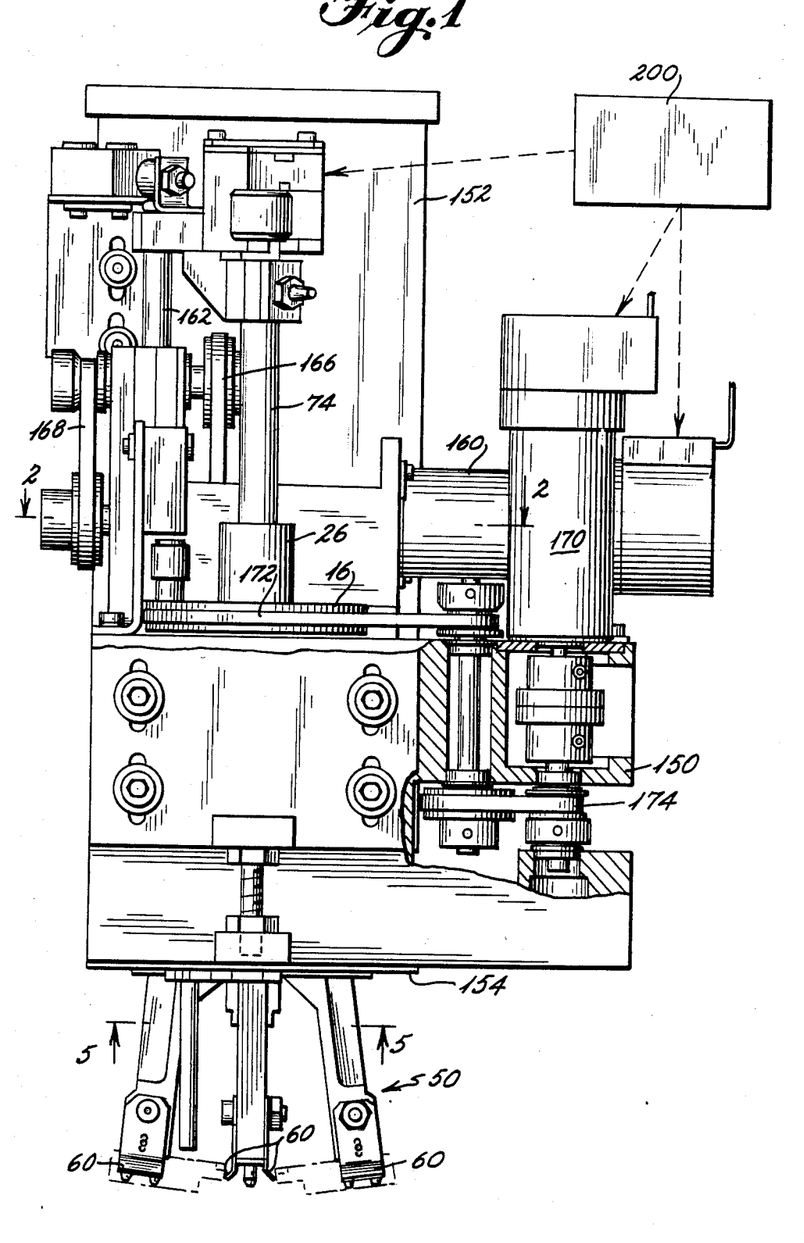
FIG. 1 is a front elevation, partially broken away, of the inventive device.
Figure 2:
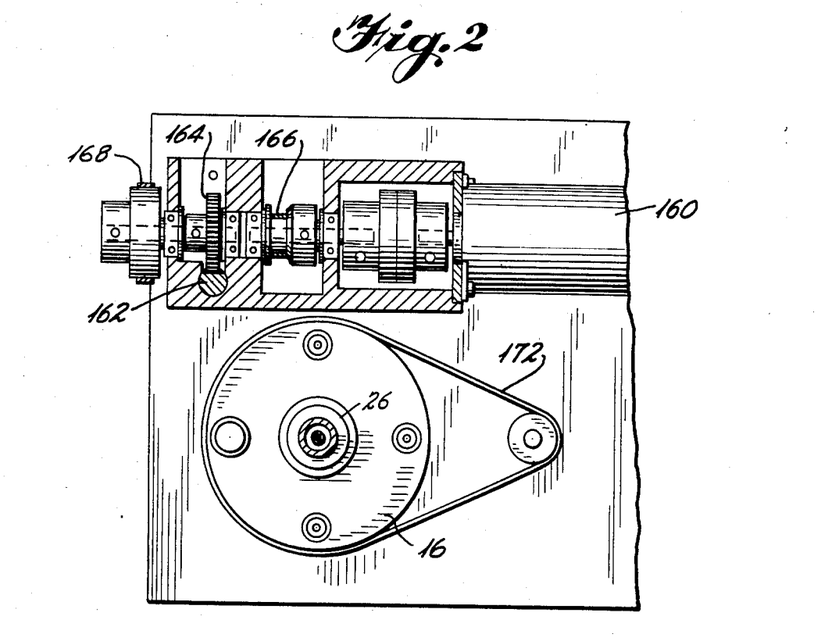
FIG. 2 is a cross section, generally viewed in the direction of arrows 2—2 of FIG. 1.
Figure 3:
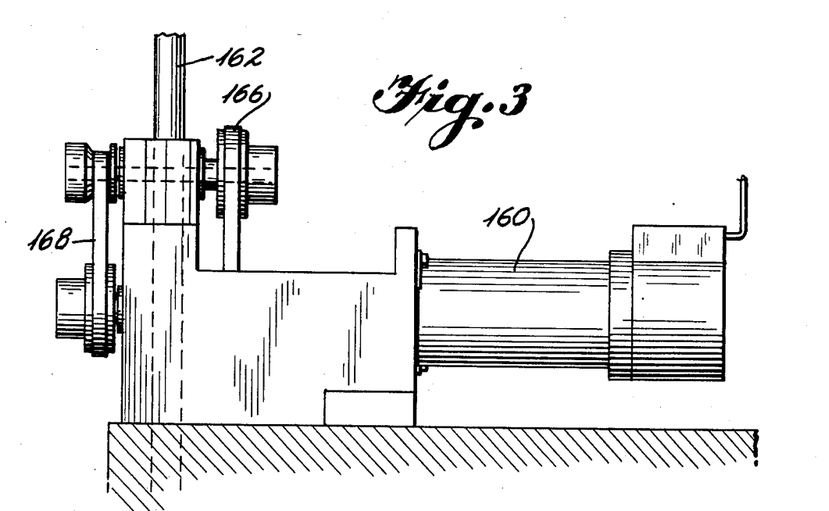
FIG. 3 is a partial view of FIG. 1 illustrating the Z-axis motor and associated timing belts.

Referring to FIG. 1, a support bracket 152 supports main housing 150 and provides means for attaching main housing 150 to an overhead positioning system by which it is movable in the X and Y directions. Supported on main housing 150 are a Z-axis motor 160, seen in better detail in FIGS. 2 and 3, in which it may be seen that gear rack 162, also seen in FIG. 1, is movable up and down by mechanical connection with motor 160 via timing belts 166, 168, and spur gear 164. Gear rack 162 is connected to spindle 74 via brackets 112 and 102 such that vertical reciprocation of gear rack 162 provides vertical reciprocation of spindle 74. Spindle 74 is also rotatable about longitudinal axis 11 via connection to sprocket 16 which, in turn, is driven by a timing belt and drive arrangement 172, 174 by orientation motor 170. As may also be seen from FIG. 1, the control of the orientation motor 170 and Z-axis motor 160 is by way of controller 180. Controller 200 may include a microprocessor or the like and receives signals from a load cell 110, as will be explained in greater detail later, in order to properly control pressure on a component during placement thereof onto a substrate by downward movement of spindle 74.

Figure 4:
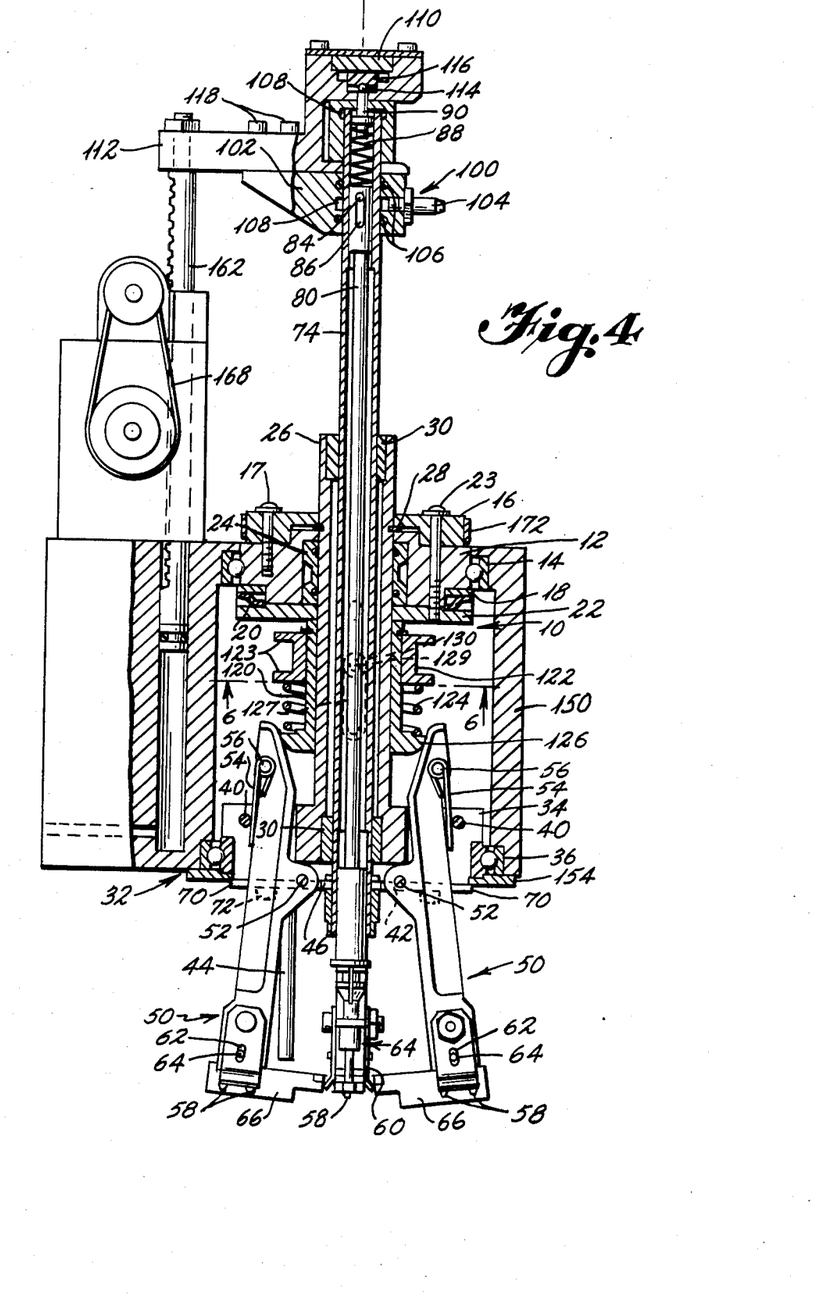
FIG. 4 is a partial left side elevation of the device of FIG. 1, with portions thereof broken away and shown in cross section for purposes of explanation.

The assembly of FIG. 4 is held in main housing 150 by retaining washer 154 engaging the underside of lower support bearing 36. Main housing 150 is also provided with a slot (not shown) such that a yoke or the like extends through the walls of housing 150 in order to actuate an outer cam 122, for a reason yet to be explained. The assembly of FIG. 4 has upper and lower portions 10, 32, respectively, with a hub 12 of upper portion 10 supporting bearing 14 on spindle housing 26. Spring clip 28 fits into an annular groove of spindle housing 26 and is clamped between hub 12 and a sprocket 16 by tightening machine screws 17. In such a manner, upper portion 10 is fixed longitudinally relative to spindle housing 26. In order to fix upper portion 10 rotationally relative to spindle housing 26, a speith clamping sleeve 24 is sandwiched between hub 12 and retaining washer 22. Tightening of machine screw 23 causes speith sleeve 24 to be wedged between hub 12 and spindle housing 26 and to provide attachment therebetween so that hub 12 will not rotate relative to housing 26. Bearing 14 is preloaded by wave washer 20 which is retained between spacer 18 and retaining washer 22.

Figure 5:
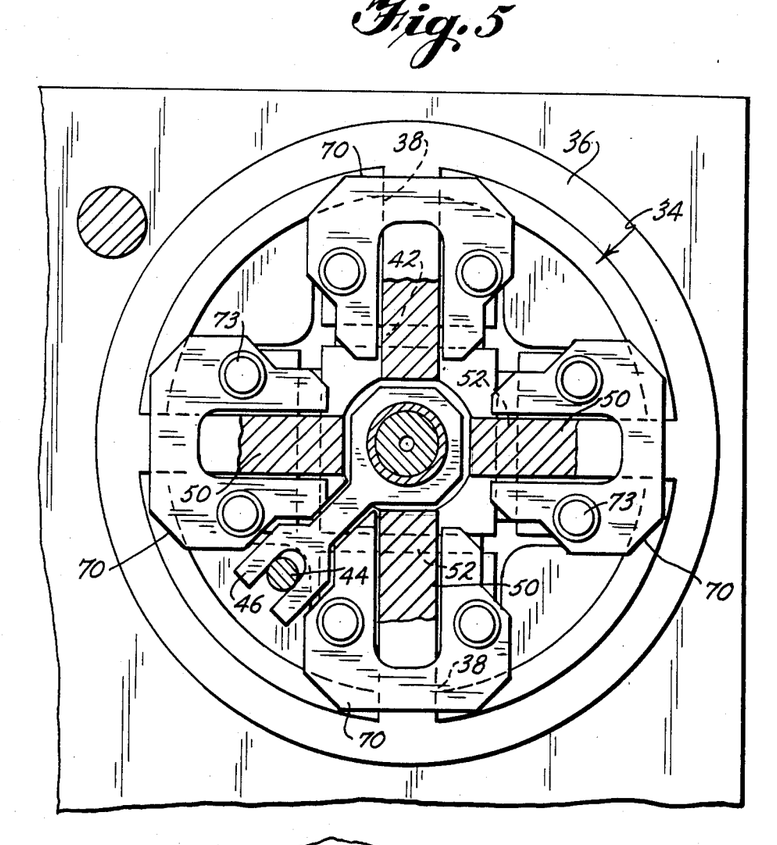
FIG. 5 is a cross section, as generally viewed in the direction of arrows 5—5 of FIG. 1.
Figure 6:
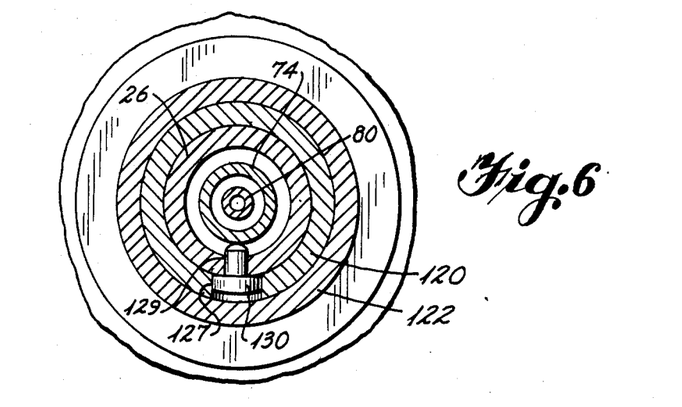
FIG. 6 is a cross section, as generally viewed in the direction of arrows 6—6 of FIG. 4.
Figure 7:
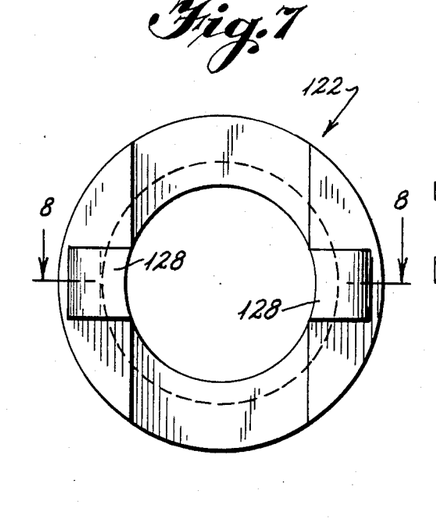
FIG. 7 is a bottom plan view of a cam for actuating one pair of centering fingers.
Figure 8:
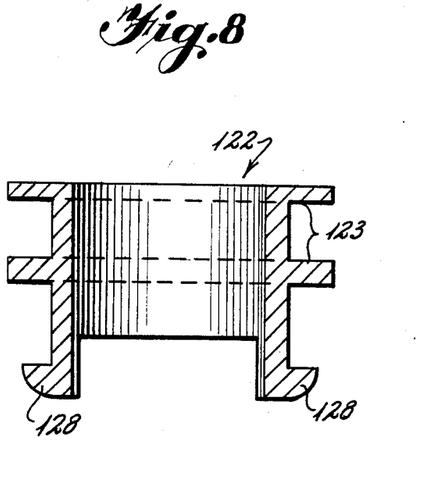
FIG. 8 is a cross section, as generally viewed in the direction of arrows 8—8 of FIG. 7.
Figures 9, 10:
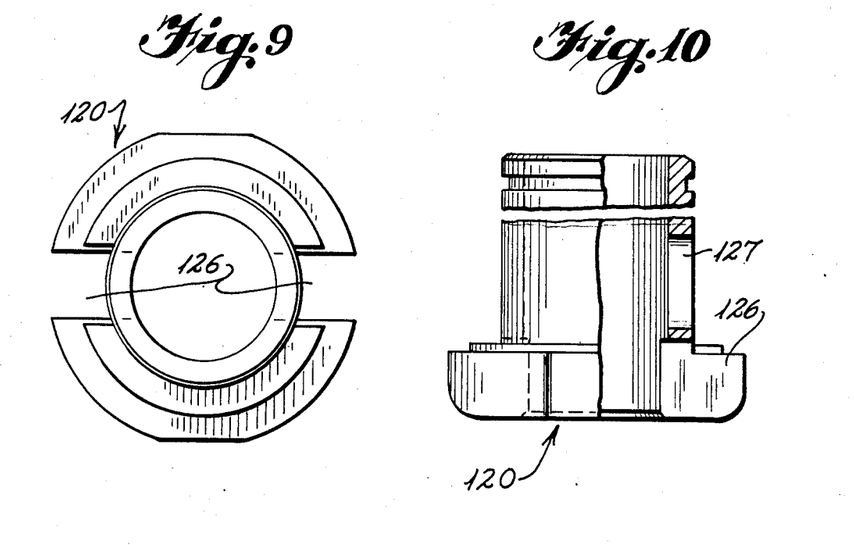
FIG. 9 is a top plan view of a cam for actuating the other pair of centering fingers.
FIG. 10 is a front elevation, partially broken away, of the device of FIG. 9.
Figure 11:
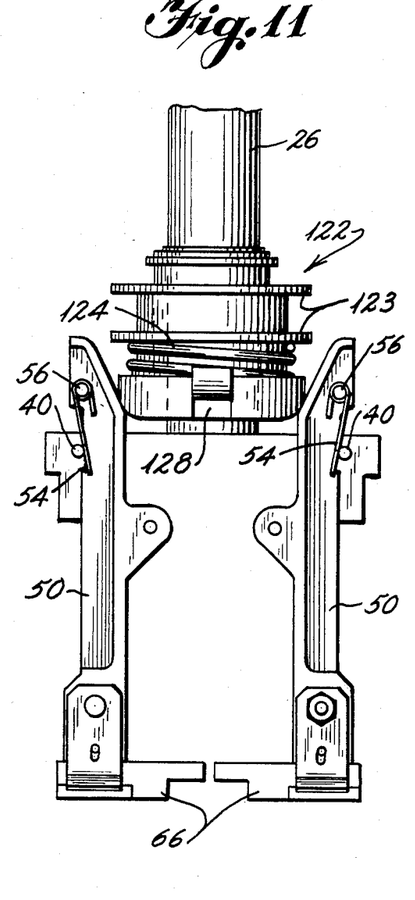
FIGS. 11 and 12 are partial views of the pivotal centering fingers and cam means for actuating them.
Figure 12:
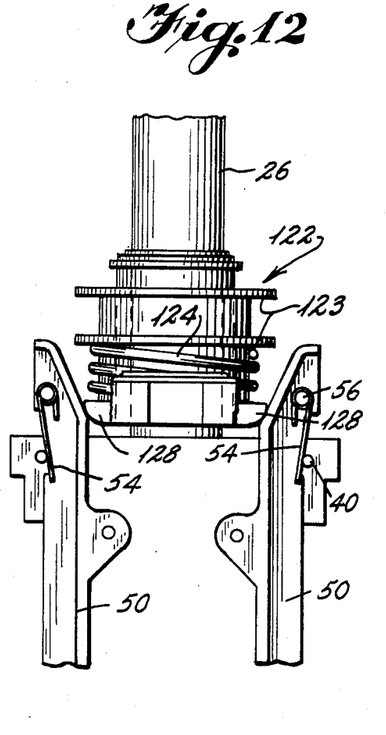

Spindle housing 26 is adapted for sliding along the length of spindle 74 via bronze bearings 30. The lower portion of spindle housing 26 is enlarged at 34 in order to provide attachment of lower bearing 36 and pivotal centering arms 50. Referring to FIGS. 4 and 5, centering arms 50 are pivotal on pins 52 which are retained in channels in the bottom face of spindle housing enlargement 34 by retainer plates 70. Retainer plates 70 are generally U-shaped as seen in FIG. 5. Spindle housing enlargement 34 is provided with quadrature slots 38 (FIG. 5) in which the upper portions of arms 50 may pivot, with the extent of such pivoting being limited by pins 40. Pins 56 in the upper portions of arms 50 each support a spring 54 which, at its lower end, bears against a corresponding limit pin 40, such that arms 50 are biased to the normal positions illustrated in FIG. 4. Each arm 50 supports a centering finger 66 by means of locater pins 58 and spring metal retainers 60, such that centering fingers 66 are easily replaceable by a mechanism yet to be explained.

As seen in FIG. 5, the preferred embodiment includes four centering arms 50 such that opposed arms form a pair and two pairs of arms 50 are at right angles to each other. Each pair of opposed arms is separately actuated for engaging and centering the body of a component by means of cams 120, 122. The structure of cams 120 and 122 and their interaction with arms 50 are illustrated in FIGS. 4, 5, and 7-12. Referring to these figures, it may be seen that a compression spring 124 biases cams 120 and 122 apart such that differential movement of the cams 120, 122 along axis 11 may be provided according to the spring constant of spring 124. Cam actuation may be provided by a yoke or the like extending through the wall of housing 150 and into engagement with cam 122 between flanges 123. Camming ears 128 of outer cam 122 are slidable within cut away portions 126 of inner cam 120, such that cam 122 is telescopic over cam 120. Accordingly, movement of cam 122 downwardly (as viewed in FIG. 4) will cause actuation of one pair of opposed centering arms 50 by means of cam 120 engaging the upper portions thereof. At some time thereafter, according to the spring constant of spring 124, camming ears 128 of cam 122 will engage the other pair of centering arms 50. Such an arrangement allows for centering of a component along one axis such as the X axis prior to centering of the same component along the Y axis.

Such positive cam action ensures exact centering of a component upon longitudial axis 11 by providing a positive, controlled rate of pivoting of arms 50 and closure of fingers 66 upon a component. Prior art centering fingers provide inaccuracies in centering according to inaccuracies in spring constants, since springs are used to bias the centering fingers to a closed or centering position, as opposed to the positive cam biasing of the instant invention.

Orientation of a component about longitudinal axis 11 is provided by rotating spindle housing 26 about axis 11 via sprocket 16, which is driven by orient motor 170 via timing belts 172, 174.

Figures 14, 15, 16, 17:
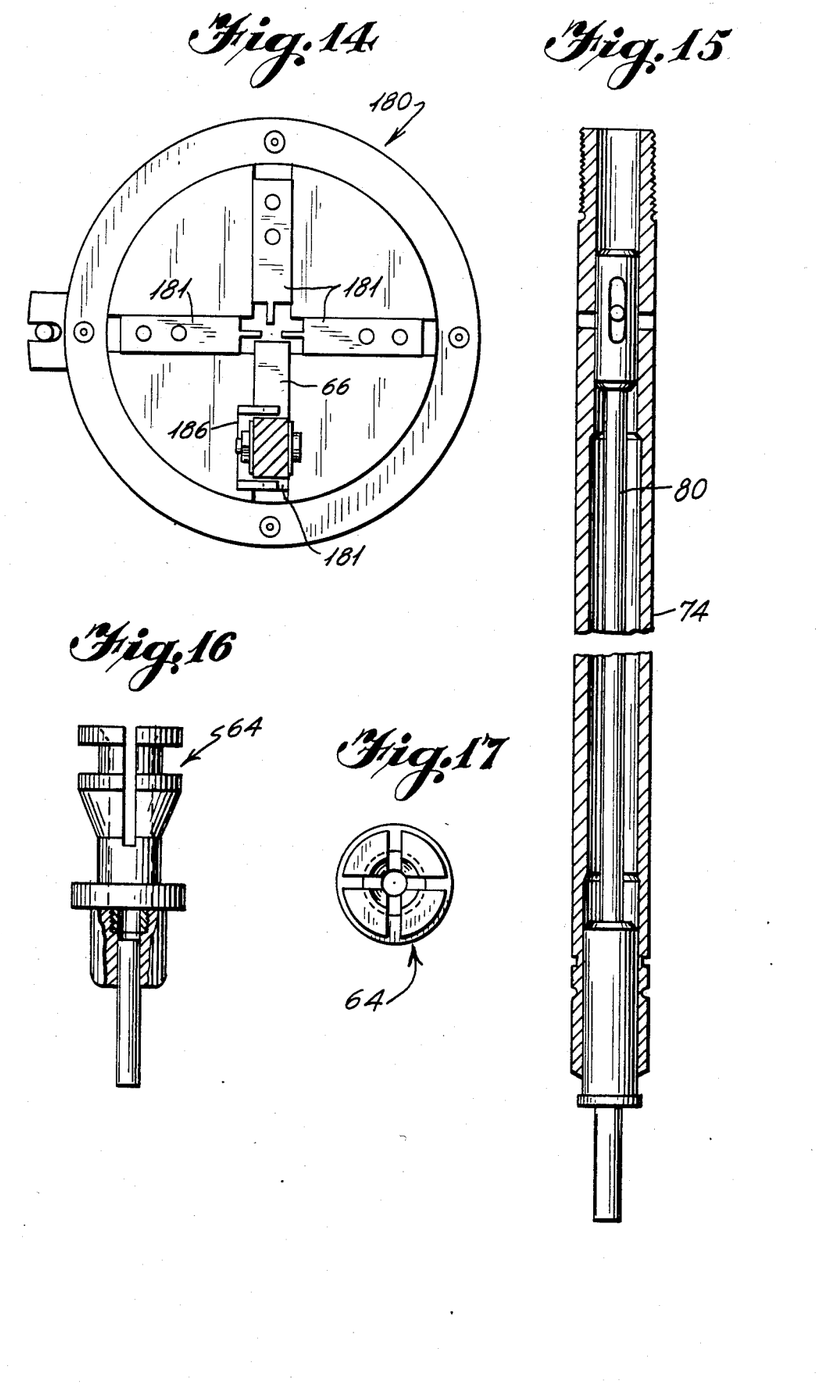
FIG. 14 is a partial, top plan view of the finger tip replacing mechanism.
FIG. 15 is a detailed view, partially in cross section, of the vacuum nozzle and spindle.
FIG. 16 is a front elevation, partially in cross section, of a replaceable tip for the vacuum tube.
FIG. 17 is a top plan view of the device of FIG. 16.

In order to hold a component during such centering action, as well as to pick up such a component from supply and to place it upon a substrate, a vacuum tube 80 is provided. A replaceable tip 64 of vacuum tube 80 (as shown in FIGS. 16 and 17), communicates with a vacuum connection nipple 104 on the opposite end of tube 80 via annular groove 108 surrounding spindle 74 and vacuum tube 80. Communication through tube 80 and spindle 74 is via appropriate openings (not shown). Loss of vacuum is prevented by O-rings 106 positioned above and below annular groove 108.

In operation, the tooling assembly of FIGS. 1 and 4 is suspended above a work surface and translatable to various positions above this surface by a well known XY positioning system (not shown). Accordingly, the head may be positioned above a component supply, whereupon Z-axis motor 160 is actuated to lower spindle 74 and allow pick-up of a component by vacuum nozzle tip 64 in the usual manner. Thereafter, Z-axis motor 160 is again actuated to raise spindle 74 with nozzle 64 such that the tooling assembly is transversly movable above the work surface to a preselected location directly above a point on the substrate at which the component will be positioned.

Once the component has been picked up and is held on the tip 64 of vacuum nozzle 80, the centering of the component upon the tip 64 may be accomplished by actuation of centering arms 50, as explained earlier. After or during such centering, the component may be oriented about longitudinal axis 11 by engaging centering fingers 66 with the component and rotating spindle housing 26 together with spindle 74 via sprocket 16 and orientation motor 170, thus providing control of the component during reorienting thereof and avoiding any possible problems of miscentering of the component during such reorienting. Having properly oriented and centered the component upon tip 64, spindle 74 may be lowered by Z-axis motor 160 to position the component upon the substrate, whereupon the vacuum is interrupted.

Protection of the component, the substrate and tooling assembly from damaging placement pressures, as well as being able to sense when the component has reached the substrate, is provided by a load cell assembly by which the placement pressure is sensed and communicated to controller 200. As may be seen from FIG. 4, a load cell 110 is supported by bracket 112 above spindle 74. Load cell 110 is fixed relative to spindle 74, and vacuum tube 80 is telescopic within spindle 74 as limited by slot 86 and cross pin 84. A compression spring 88 is sandwiched between the top of vacuum tube 80 and the bottom of a piston 90, with the top of piston 90 engaging a ball 114 which, in turn, engages a leveling plate 116. Leveling plate 116 and ball 114 provide for even distribution of forces to the load cell 110, typically a piezoelectric crystal. Accordingly, the pressure encountered by placing the component on the substrate is transmitted (via vacuum tube 80, spring 88, piston 90, ball 114, and leveler plate 116) to the load cell 110. Spring 88 is appropriately selected so that the compression thereof is the proper function of the pressure applied, in order that, upon sensing the pressure upon the component during sandwiching thereof between the nozzle tip 64 and the substrate upon which it is being placed, appropriate Z-axis control may be actuated in order to provide the protection and sensing mentioned above. For instance, in a prototype of this embodiment 40 grams of placement pressure corresponds to 0.030 inches of spring compression and 80 grams of pressure corresponds to 0.060 inches of spring compression. As may be appreciated, there is a differential travel of the vacuum tube 80 in relation to the placement pressure, being applied and sensed. The linear voltage output of load cell 110, indicating the placement pressure is transmitted to a controller 200 (FIG. 1) for the appropriate control of Z-axis motor 160. Such a linear output from the load cell 110 allows exacting Z-axis control of the vacuum nozzle 80.

A particular improvement of the instant invention over the prior art incorporates interchangeable centering fingers 66, along with an interchangeable vacuum nozzle 64, so that high speed, automated changing of the centering fingers 66 may be effected according to the sizes and shapes of the finger tips 66 required of the components being operated upon. As well as being applicable to manual changing of the tips 66, such a feature is of utmost importance in the high speed automated machinery now used in population of printed circuit boards. The set-up time normally required in order to operate on various configurations and sizes of components is something to be greatly avoided when at all possible. By the instant invention, the usual practice of changing complete head assemblies is easily avoided by either of two methods of adapting to such varying components.

In one method of doing so, centering arms 50 are easily removable and replaceable, as by removing C-shaped retaining plates 70 and pulling arms 50 downwardly (as viewed in FIG. 4). Different arms 50 are replaceable therein by the reverse action, i.e., slipping the arms upwardly in the quadrature slots 38 of spindle housing enlargement 34 and replacing retaining plates 70.

Figure 13:
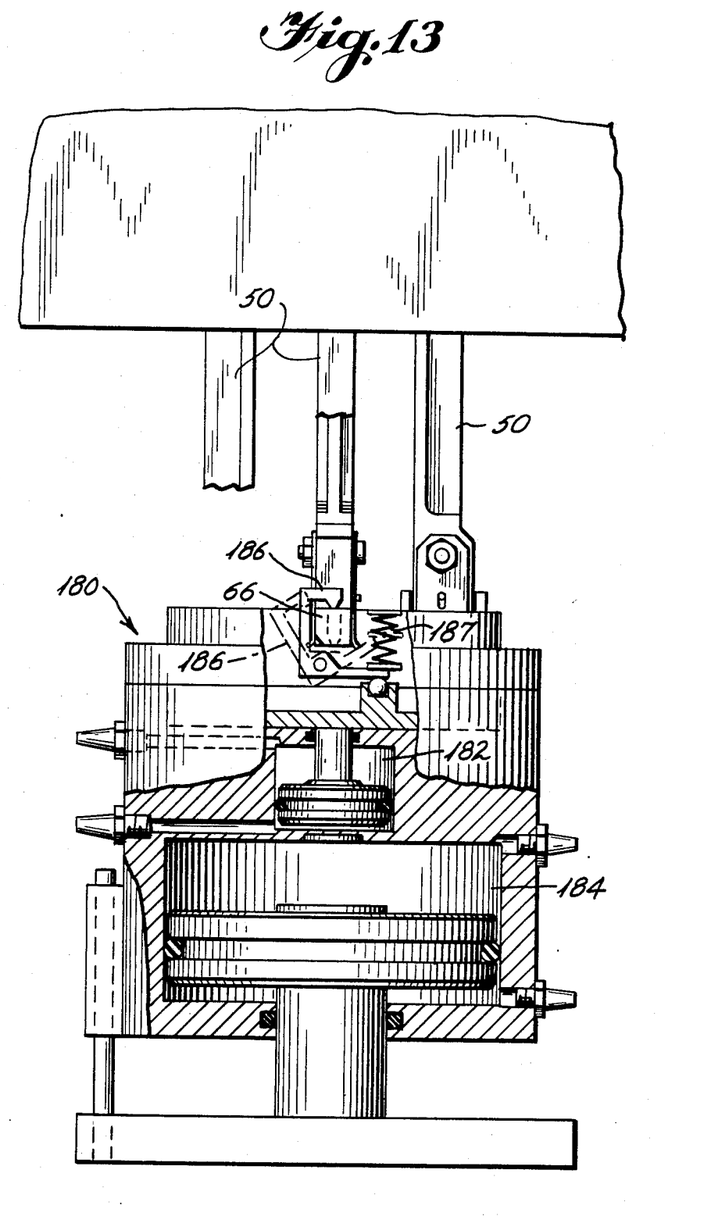
FIG. 13 is a front elevation, partially broken away of a tip replacing mechanism for the centering fingers.

A still faster method for changing the tooling necessary to center a particular component is provided by the apparatus of FIGS. 13 and 14, wherein only one of the replacement centering finger tips 66 is shown (in order to illustrate operation of the apparatus). Although showing only one replaceable finger 66, each of the four positions of replacement mechanism 180, corresponding to the positions of centering arms 50, will have the appropriate replacement tips 66 located therein.

In operation of the automated tip changer, the head assembly 150 of FIGS. 4 and 5 is translated to a position above a tooling mechanism 180. When head assembly 152 already has centering fingers 50 replacement mechanism 180 will be empty so that, upon firing cylinder 182 to open the rotatable tip grabber arm 186 against the bias of spring 187, cylinder 184 may be fired to raise mechanism 180 and receive tips 66 in quadrature spaced nests 181 of mechanism 180. Thereafter, cylinder 182 is reverse actuated allowing a spring 187 to close each gripper 186 upon the corresponding finger tip 66. At this time, cylinder 184 is again actuated to lower the mechanism 180 such that finger tips 66 are disengaged from spring holders 60 of centering arms 50. Thereafter, the head assembly is repositioned above another replacement mechanism 180 which already has centering tips 66 secured therein, and a reverse procedure is performed in order to load new tips onto the centering arms 50.

An additional feature of the invention is the provision for stopping the vacuum tube 80 at various heights in the upstroke according to the size and/or configuration of the component body. With such provision, each set of tips 66 may accommodate more than one particular size and or configuration of component at more than one vertical level of the tip 66. Accuracy for this feature is provided by controller 20 and Z-axis servomotor 160.

We claim:

1. In a method of handling electrical components comprising picking up an electrical component by vacuum at the tip of a nozzle and placing said component onto a selected position of a substrate with a placement pressure, the improvement comprising the steps of:
   sensing and monitoring pressure experienced by said component during said placing; and
   limiting said placement pressure automatically to a preselected amount.

2. In a method of handling electrical components comprising aligning a reference axis of an electrical component with a longitudinal axis of an apparatus by closing tips of a set of aligning fingers onto said component and engaging at least one edge of said component in order to move said component transverse to said longitudinal axis to effect said aligning, wherein said method further comprises picking up said component by vacuum at the tip of a nozzle, supporting said component thereon by vacuum during said aligning, and placing said component onto a selected position of a substrate with a placement pressure, the improvement comprising the steps of:
   closing at least a first pair of opposed tips, generally centered on said longitudinal axis, positively and at a controlled rate in order to improve an aligning accuracy;
   closing a second pair of opposed tips, generally centered on said longitudinal axis, positively and at a controlled rate, after closing of said one pair, in order to provide for aligning of said reference and longitudinal axes by positively moving said component along two different directions transverse to said longitudinal axis;

sensing and monitoring pressure experienced by said component during said placing; and limiting said placement pressure automatically to a preselected amount.

3. In an apparatus for effecting an electrical component handling method comprising picking up an electrical component by vacuum at the tip of a nozzle and placing said component onto a selected position of a substrate with a placement pressure, the improvement comprising:

means, operatively associated with said nozzle, for sensing and monitoring pressure experienced by said component during said placing;

means, operatively associated with said sensing means, for limiting said placement pressure to a preselected amount in response to said sensing and according to a controller.

4. In a method of aligning a reference axis of an electrical component with a longitudinal axis of an apparatus by closing tips of a set of aligning fingers onto said component and engaging at least one edge of said component in order to move said component transverse to said longitudinal axis to effect said aligning, the improvement comprising the steps of:

providing plural sets of replaceable tips corresponding to said aligning fingers set, each tips set being particularly configured to facilitate aligning of components of a correspondingly particular shape; and replacing said tips sets on said aligning fingers automatically according to a controller.

5. In an apparatus for effecting a method of handling electrical components comprising aligning a reference axis of an electrical component with a longitudinal axis of the apparatus by closing tips of a set of aligning fingers onto said component and engaging at least one edge of said component in order to move said component transverse to said longitudinal axis to effect said aligning, wherein said method further comprises picking up said component by vacuum at the tip of a nozzle, supporting said component thereon by vacuum during said aligning, and placing said component onto a selected position of a substrate with a placement pressure, the improvement comprising:

means for effecting closing of a first pair of said tips generally centered on said longitudinal axis, positively and at a controlled rate in order to improve an aligning accuracy;

means for closing a second pair of opposed tips, operatively associated with said first pair of tips and generally centered on said longitudinal axis, positively and at a controlled rate, after closing of said first pair, in order to provide for aligning of said reference and longitudinal axes by positively moving said component along two different directions transverse to said longitudinal axis;

means, operatively associated with said nozzle, for sensing pressure experienced by said component during said placing; and means, operatively associated with said sensing means, for limiting said placement pressure to a preselected amount in response to said sensing and according to a controller.

6. The improvement as in claim 5, and further comprising:

camming means, operatively associated with said tips, for effecting positive closing of said tips at a controlled rate.

7. The improvement as in claim 6, wherein said camming means comprises:

a first cam positively engageable with each finger of at least one opposed pair of said fingers during said closing and aligning.

8. The improvement as in claim 5, said pressure sensing means further comprising:

a piezoelectric load cell outputting a signal in response to pressure applied thereto;

a compression spring interposed between and mechanically connected to said vacuum nozzle and said load cell; and a reciprocatable spindle supporting said vacuum nozzle, compression spring, and load cell such that, upon moving said spindle and applying pressure to said component, said spring is compressed as a function of said placement pressure while cushioning transfer of said pressure to said load cell, and said vacuum nozzle retracts differentially in relation to said placement pressure thus enabling accurate control of said placement pressure by moving said spindle according to a dynamic comparison of said load cell output signal with a preset value indicative of said preselected amount of pressure to be applied.

9. The improvement as in claim 7, and further comprising:

a second cam positively engageable with each finger of another opposed pair of said fingers after closing of said one pair, said one and another opposed pairs of fingers being operatively associated such that said component is positively moveable along two different directions transverse to said longitudinal axis in order to accurately align said component reference axis ad said longitudinal axis.

10. In an apparatus for aligning a reference axis of an electrical component with a longitudinal axis of the apparatus by closing tips of a set of aligning fingers onto said component and engaging at least one edge of said component in order to move said component transverse to said longitudinal axis to effect said aligning, the improvement comprising:

plural sets of replaceable tips for and operatively associatable with said aligning fingers set, each tips set being particularly configured to facilitate aligning of components of a correspondingly particular shape; and means operatively associated with said fingers for replacing said tips sets on said aligning fingers automatically according to a controller.

* * * * *